United States Patent
Mitani et al.

(10) Patent No.: US 6,891,238 B2
(45) Date of Patent: May 10, 2005

(54) SEMICONDUCTOR DEVICE AND METHOD OF MANUFACTURING THE SAME

(75) Inventors: Yuichiro Mitani, Kanagawa-ken (JP); Hideki Satake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 10/109,893

(22) Filed: Apr. 1, 2002

(65) Prior Publication Data

US 2002/0140043 A1 Oct. 3, 2002

(30) Foreign Application Priority Data

Mar. 30, 2001 (JP) .................................... P2001-100399

(51) Int. Cl.$^7$ .......................... H01L 29/76; H01L 29/94; H01L 31/62; H01L 31/113; H01L 31/119
(52) U.S. Cl. ...................................... 257/410; 257/655
(58) Field of Search ................................ 257/410, 655, 257/411

(56) References Cited

U.S. PATENT DOCUMENTS

| | | | |
|---|---|---|---|
| 5,972,765 A | * 10/1999 | Clark et al. ................. | 438/308 |
| 6,023,093 A | 2/2000 | Gregory et al. | |
| 6,143,632 A | * 11/2000 | Ishida et al. ................ | 438/543 |
| 6,208,002 B1 | 3/2001 | Satake et al. | |
| 6,326,274 B2 | * 12/2001 | Rost et al. .................. | 438/305 |
| 6,436,799 B1 | * 8/2002 | Ramkumar et al. ......... | 438/530 |
| 2001/0007785 A1 | * 7/2001 | Rost et al. .................. | 438/305 |
| 2001/0024860 A1 | * 9/2001 | Park et al. .................. | 438/287 |
| 2002/0000590 A1 | * 1/2002 | Yamamichi ................. | 257/296 |
| 2002/0047169 A1 | * 4/2002 | Kunikiyo .................... | 257/410 |

OTHER PUBLICATIONS

J.W. Lyding and K. Hess, I.C. Kizilyalli, Reduction of Hot Electron Degradation in Metal Oxide Semiconductor Transistors by Deuterium Processing, Applied Physics Letters, vol. 68, No. 18, Apr. 29, 1996, pp. 2526–2528.

Hyojune Kim anf Hyunsang Hwang, High–Quality Ultrathin Gate Oxide Prepared By Oxidation in $D_2O$, Applied Physics Letters, vol. 74, No. 5, Feb. 1, 1999, pp. 709–710.

* cited by examiner

*Primary Examiner*—W. David Coleman
(74) *Attorney, Agent, or Firm*—Oblon, Spivak, McClelland, Maier & Neustadt, P.C.

(57) ABSTRACT

A semiconductor device including a silicon substrate, a gate insulator film formed on the silicon substrate and including silicon, deuterium, and at least one of oxygen and nitrogen, and a gate electrode formed on the gate insulator film wherein a deuterium concentration in a vicinity of an interface of the gate insulator film with the gate electrode is at least $1 \times 10^7$ cm$^{-3}$, and a deuterium concentration in a vicinity of an interface of the gate insulator film with the silicon substrate is higher than the deuterium concentration in the vicinity of the interface of the gate insulation film with the gate electrode.

9 Claims, 8 Drawing Sheets

SEMICONDUCTOR DEVICE AND METHOD OF MANUFACTURING THE SAME

CROSS-REFERENCE TO A RELATED APPLICATION

This application is related and claims priority to Japanese Patent Application No. P2001-100399, filed on Mar. 30, 2001, the entire contents of which are incorporated herein by reference.

BACKGROUND OF THE INVENTION

1. Field of the Invention

The present invention relates to a semiconductor device, and a method of manufacturing the same.

2. Discussion of the Background

In a device where a gate insulator film is used as a tunnel insulator film as represented by an electrically erasable and programmable read-only memory (EEPROM), high electric fields exceeding 10 MV/cm are applied to the gate oxide film in order to write and erase information. Further, gate insulator films employed as MOSFETs of logic devices are subjected to even higher electric fields requiring microfabrication of the MOSFET in order to maintain performance.

Such a gate insulator film requires a high reliability due to the high electric field applied thereto and the high energy of the electrons transiting the electric field. By way of example, there is a problem that, when an electrical stress is applied, defects are created in the gate insulator film. Since the defects created form seeds for inducing dielectric breakdown, or the defects created induce a low electric field leakage current called a "stress-induced leakage current" (SILC). Diminution of defect creation governs the reliability of the semiconductor device operating as a gate insulator film. Regarding a mechanism in which such defects appear, hydrogen atoms existing in the film are related to defect generation. Therefore, a technique has heretofore been proposed in which hydrogen in the gate insulator film is substituted with deuterium or tritium, being an isotope of hydrogen, thereby to diminish the appearance of defects. A method for introducing deuterium into a gate insulator film is, for example, a method in which, during annealing of a transistor, the gate insulator film is exposed to an atmosphere of a nitrogen-diluted deuterium gas or exposed to an atmosphere of 100% deuterium gas, instead of annealing thereof in a nitrogen-diluted hydrogen gas. There is also a method in which a silicon substrate is exposed to deuterium oxide ($D_2O$), thereby to form a gate oxide film (Official Gazette of Japanese Patent Laid-Open No. 12609/1998), or a method in which a gate oxide film is nitrided by exposing the gate oxide film to deuterated ammonia ($ND_3$), thereby to form a silicon oxynitride film containing deuterium (Official Gazette of Japanese Patent Laid-Open No. 274489/1999).

BRIEF SUMMARY OF THE INVENTION

The present invention has been made in view of the above problems, and provides a semiconductor device including a gate insulator film of high electrical reliability and a method of manufacturing the semiconductor device.

A first aspect of the present invention is a semiconductor device including a silicon substrate, a gate insulator film formed on the silicon substrate and including silicon, deuterium, and at least one of oxygen and nitrogen, and a gate electrode formed on the gate insulator film wherein a deuterium concentration in the vicinity of an interface of the gate insulator film with the gate electrode is at least $1 \times 10^{17}$ $cm^{-3}$. The deuterium concentration in the vicinity of the interface of the gate insulator film with the silicon substrate is higher than the deuterium concentration in the vicinity of the interface of the gate insulator film with the gate electrode.

A second aspect of the present invention is a method of manufacturing a semiconductor device including the steps of forming a gate insulator film including oxygen and/or nitrogen on a silicon substrate by exposing the silicon substrate to an atmosphere including oxygen and/or nitrogen, introducing deuterium into the gate insulator film at a temperature which is not lower than a temperature at which the gate insulator film is formed, and forming a gate electrode on the gate insulator film.

A third aspect of the present invention is a method of manufacturing a semiconductor device including the sequential steps of forming a gate insulator film including oxygen and/or nitrogen on a silicon substrate by exposing the silicon substrate to an atmosphere including oxygen and/or nitrogen, forming a gate electrode on the gate insulator film, and introducing deuterium into the gate insulator film at a temperature which is not lower than a temperature at which the gate insulator film is formed.

A fourth aspect of the present invention is a method of manufacturing a semiconductor device including steps of forming a gate insulator film including oxygen and/or nitrogen on a silicon substrate by exposing the silicon substrate to an atmosphere including oxygen and/or nitrogen, forming a gate material film on the gate insulator film, introducing deuterium into the gate insulator film at a temperature which is not lower than a temperature at which the gate insulator film is formed, and patterning the gate material film to form a gate electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
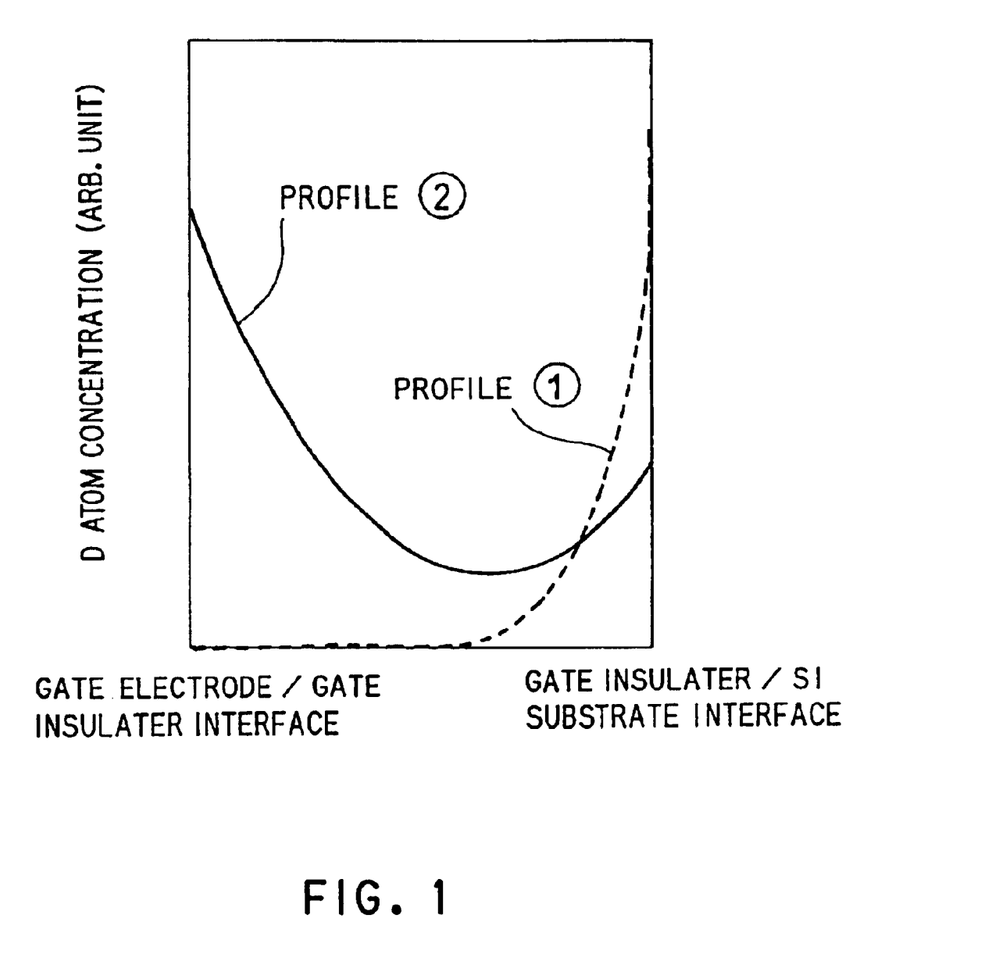
FIG. 1 is a characteristic diagram showing deuterium concentrations in gate insulator films fabricated by prior-art methods.

Referring now to the drawings, wherein like reference numerals designate identical or corresponding parts throughout the several views, and more particularly to FIG. 1 thereof, FIG. 1 is a characteristic diagram showing deuterium concentrations in gate insulator films fabricated by prior-art methods.

The deuterium concentration profile indicated by a broken line (1) in FIG. 1 corresponds to a case where a gate insulator film made of $SiO_2$ was formed on a silicon substrate at 800° C., the gate insulator film was exposed to a gaseous atmosphere including deuterium at a temperature of 450° C. (i.e., lower than the temperature for forming the gate insulator film), thereby to introduce deuterium into the gate insulator film, and a gate electrode was formed on the resulting gate insulator film.

As depicted by the broken line in FIG. 1, in this method, deuterium atoms are introduced into a vicinity of an interface between the silicon substrate and the gate insulator film, but a sufficient amount of deuterium is not introduced into other parts of the gate insulator film. Since, in this case, deuterium is not introduced into the gate insulator film except near the vicinity of the interface thereof with the silicon substrate, the appearance of defects cannot be suppressed. Further, analysis has revealed that deuterium in the gate insulator film in the vicinity of the interface with the silicon substrate bonds to form a bond D—Si≡$Si_3$ (a state where a silicon atom with which the deuterium is bonded is bonded with three silicon atoms, that is, a state where the deuterium terminates the vacant-bonded of the silicon which primarily exists at the interface between the gate insulator film and the semiconductor substrate). The deuterium of the bond D—Si≡$Si_3$ has a problem that, when electrons of comparatively high energy as in an Fowler Nordheim F-N stress passes therethrough, the bond is easily severed to create a defect.

Further, the deuterium concentration profile indicated by the solid line (2) in FIG. 1 corresponds to a case where deuterium atoms were introduced into the gate insulator film by the method disclosed in the Official Gazette of Japanese Patent Laid-Open No. 274489/1999.

As seen by the solid line (2) in FIG. 1, with this method, the deuterium concentration is lower in the gate insulator film in the vicinity of the interface thereof with the silicon substrate than in the gate insulator film in the vicinity of the interface thereof with the gate electrode.

Figure 2:
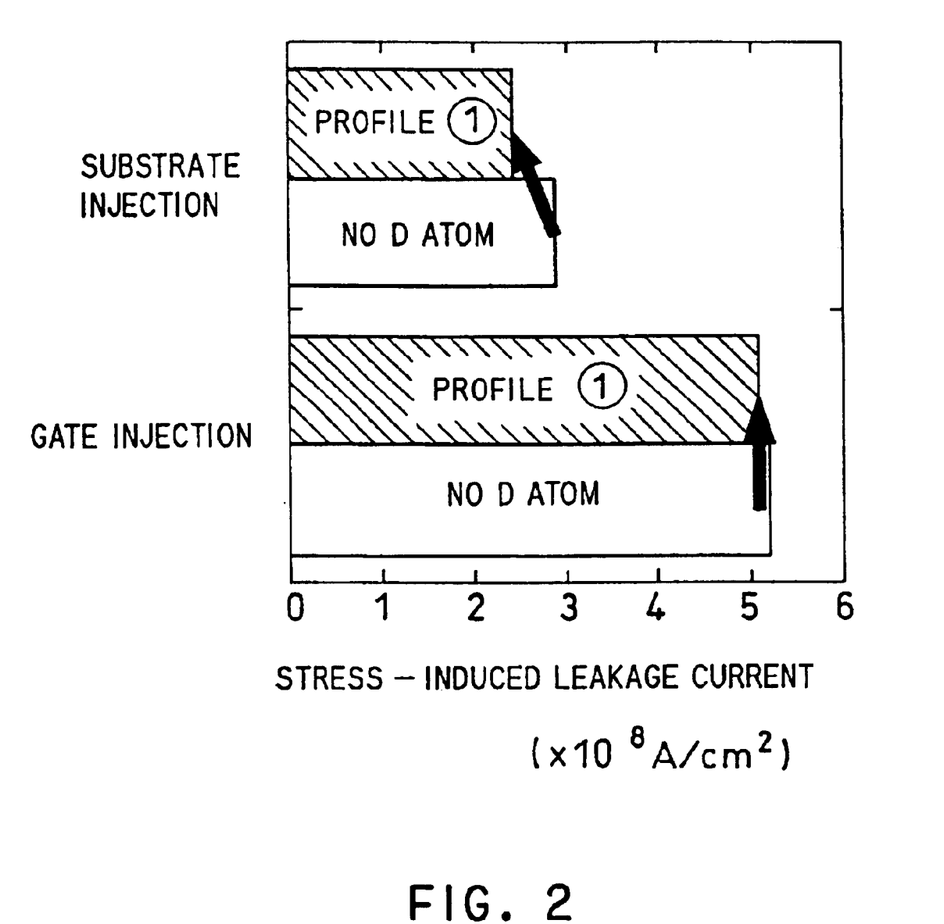
FIG. 2 is a diagram in which the stress-induced leakage currents of gate insulator films respectively fabricated with and without deuterium introduced thereinto by prior-art methods are compared under a substrate electron-injection condition and a gate electron-injection condition.

FIG. 2 shows a diagram in which the stress-induced leakage current of the gate insulator film formed by this method is compared with that of the gate insulator film made of $SiO_2$ with no deuterium introduced thereinto.

It is seen from FIG. 2 that, in a case where electrons were injected from the silicon substrate side onto the gate electrode side by F-N stress (i.e., the substrate injection condition), the stress-induced leakage current is suppressed more in the gate insulator film in which deuterium was introduced (i.e., the hatched bar graph), than in the gate insulator film in which no deuterium was introduced (i.e., the plain bar graph). On the other hand, in a case where electrons were injected from the gate electrode side toward the semiconductor substrate (i.e., the gate injection condition), the stress-induced leakage current does not appreciably differ between the gate insulator film in which deuterium was introduced (i.e., the hatched bar graph) and in the gate insulator film in which no deuterium was introduced (i.e., the plain bar graph). Since deuterium concentration in the gate insulator film in the vicinity of the interface thereof with the silicon substrate is insufficient, a satisfactory effect of suppressing the defect creation cannot be realized.

Figure 3:
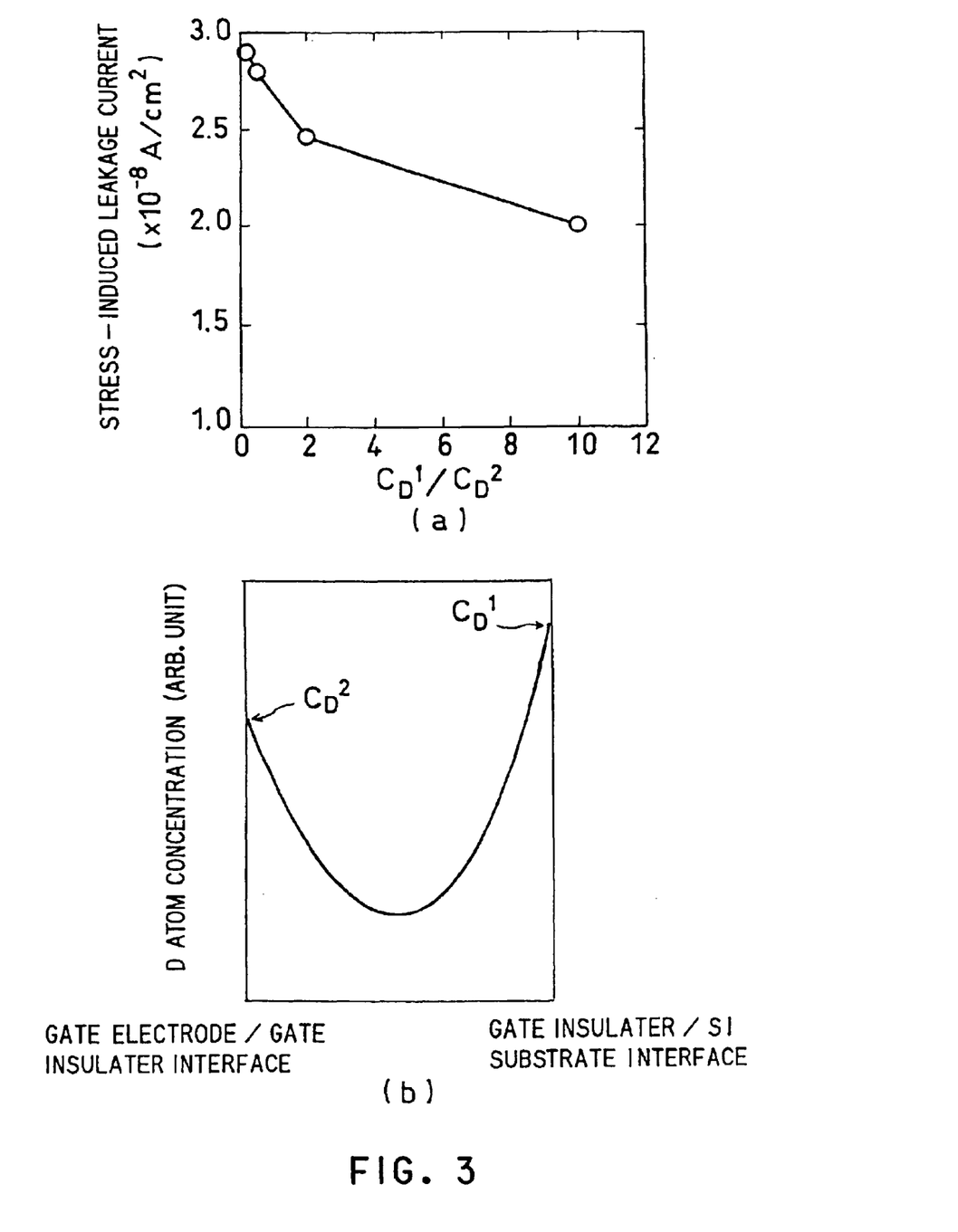
FIG. 3A is a graph showing the relationship between a ratio of a deuterium concentration in a gate insulator film in a vicinity of the interface thereof with a silicon substrate, to a deuterium concentration in the gate insulator film in a vicinity of the interface thereof with a gate electrode, and a stress-induced leakage current.
FIG. 3B is a characteristic diagram showing a deuterium concentration in a gate insulator film fabricated by a method according to the present invention.

FIG. 3A is a graph in which a ratio between a deuterium concentration ($C_D^1$) in a gate insulator film in the vicinity of the interface thereof with a silicon substrate and a deuterium concentration ($C_D^2$) in the gate insulator film in the vicinity of the interface thereof with a gate electrode, namely, $C_D^1/C_D^2$ is plotted on the abscissa axis, while a stress-induced leakage current is plotted on the ordinate axis.

FIG. 3B is a characteristic diagram showing deuterium concentration in a gate insulator film fabricated by a method according to the present invention.

As seen from FIGS. 3A and 3B, the stress-induced leakage current decreases more as the ratio $C_D^1/C_D^2$ becomes larger. That is, the stress-induced leakage current lowers when the deuterium concentration in the gate insulator film in the vicinity of the interface with the silicon substrate is larger than the deuterium concentration in the gate insulator film in the vicinity of the interface with the gate electrode.

The stress-induced leakage current abruptly increases when the ratio $C_D^1/C_D^2$ is 1 (one) or less.

From these experimental results, the stress-induced leakage current can be suppressed when the ratio $C_D^1/C_D^2$ is greater than 1 (one), more preferably at least 2.

Figure 4:
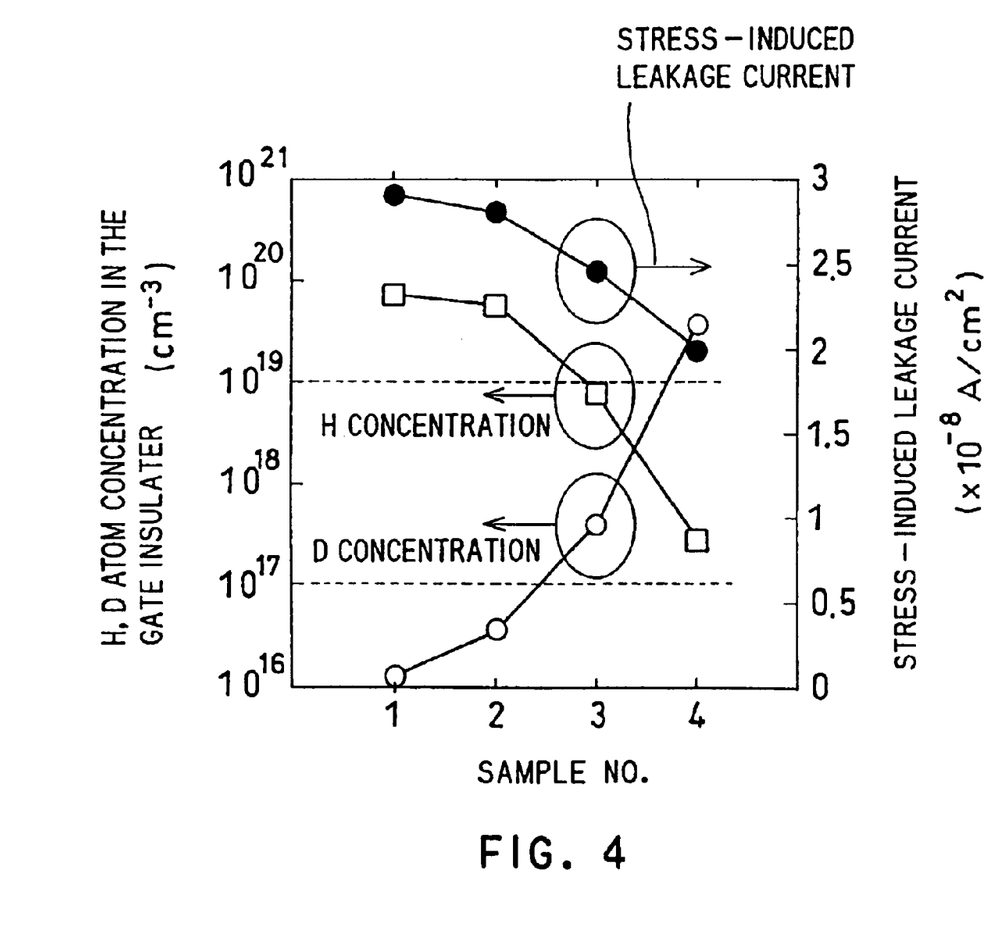
FIG. 4 is a diagram showing relationships among hydrogen and deuterium concentrations and a stress-induced leakage current in a gate insulator film, as to four samples of different deuterium concentrations.

FIG. 4 is a characteristic diagram showing deuterium concentrations and hydrogen concentrations in gate insulator films. Here, stress-induced leakage currents were respectively measured for four kinds of samples of the different hydrogen and deuterium concentrations.

FIG. 4 shows that the stress-induced leakage current decreases as the deuterium concentration becomes higher. FIG. 4 also shows that the stress-induced leakage current decreases as the hydrogen concentration becomes lower. It can be said from this experimental result that defects in the gate insulator film are suppressed at higher deuterium concentrations, or, suppressed at lower hydrogen concentrations.

Furthermore, when a deuterium concentration of at least $1 \times 10^{17}$ $cm^{-3}$ is included throughout the gate insulator film, a stress-induced leakage current of at least $5 \times 10^{-9}$ $A/cm^2$ is achieved. The hydrogen concentration on this occasion is at most $2 \times 10^{19}$ $cm^{-3}$. Preferably, a deuterium concentration of at least $1 \times 10^{18}$ $cm^{-3}$ should be included throughout the gate insulator film.

As understood from the experimental results shown in FIGS. 3A and 3B and FIG. 4, increased deuterium concentration is important for both suppressing defect creation in the gate insulator film and decreasing the stress-induced leakage current. Deuterium concentration $C_D^2$ in the gate insulator film in the vicinity of the interface with the gate electrode is at least $1\times10^{17}$ cm$^{-3}$, while the deuterium concentration ratio $C_D{}^1/C_D{}^2$ is greater than 1 (one). Consequently, the deuterium concentration $C_D{}^2$ in the gate insulator film in the vicinity of the interface with the gate electrode should preferably be at least $1\times10^{18}$ cm$^{-3}$.

Figure 5:
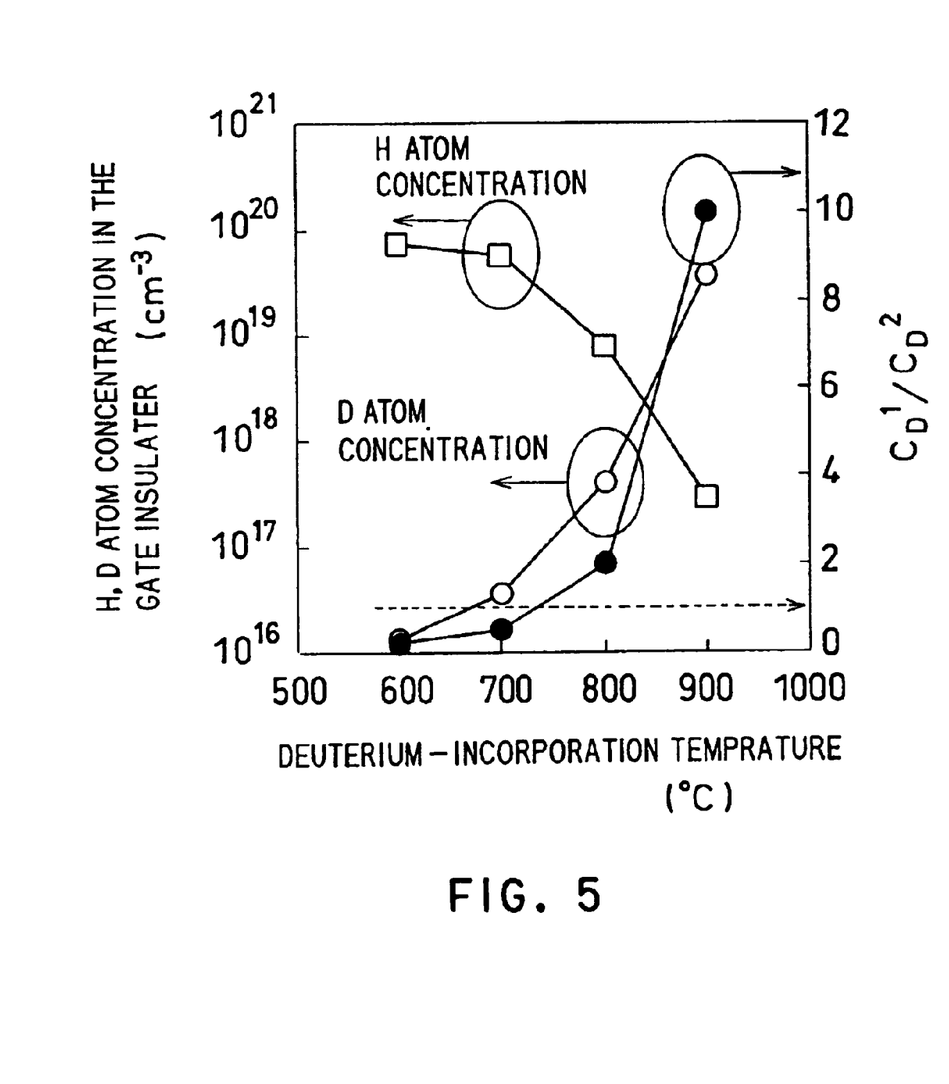
FIG. 5 is a diagram showing relationships among a temperature of a deuterium-incorporation process, hydrogen and deuterium concentrations in a gate insulator film, and a ratio of the deuterium concentration in the gate insulator film in the vicinity of the interface thereof with a silicon substrate to the deuterium concentration in the gate insulator film in the vicinity of the interface thereof with a gate electrode.

FIG. 5 is a graph showing the relationships among the deuterium incorporation temperature of a gate insulator film made of SiO$_2$ and the concentrations of hydrogen atoms and deuterium atoms in the gate insulator film. The gate insulator film was formed on a silicon substrate by thermal oxidation at 800° C.

As seen from FIG. 5, when the temperature for introducing deuterium is at least 800° C., a deuterium concentration of at least $1\times10^{17}$ cm$^{-3}$ is introduced, and a hydrogen concentration of at most $1\times10^{19}$ cm$^{-3}$ is achieved. That is, a suitable deuterium concentration profile is attained by introducing deuterium atoms into the gate insulator film at a temperature which is not lower than the temperature at which the gate insulator film was formed (i.e. the thermal oxidation temperature).

According to this method, when the gate insulator film made of SiO$_2$ is taken as an example, it is permitted to introduce deuterium atoms of at least $1\times10^{17}$ cm$^{-3}$ in the thickness direction of the film. The deuterium atoms in the gate insulator film form, not only the bond D—Si≡(Si)$_3$, but also a bond D—Si≡(Si)$_{3-n}$(O)$_n$ ($1 \leq n \leq 3$). The latter bond is such that one or more oxygen atoms are bonded to at least one silicon atom, and the deuterium atom is bonded to the attached silicon atom. Oxygen having a high electronegativity is bonded to the silicon atom to which the deuterium atom is bonded, whereby the bonding energy of a D—Si bond increases 5% or more owing to the high elecronegativity of the oxygen. Accordingly, the gate insulator film becomes stable in energy as it becomes difficult to create defects even when the gate insulator film subjected to a high electrical stress. Further, a deuterium bond to oxygen D—O—Si≡ can be formed in the gate insulator film in which the bonding energy of deuterium is still greater, so that defects become difficult to generate.

On the other hand, a bond H—Si≡ and a bond H—O—S≡ in each of which a hydrogen atom having weak bonding energy and a tendency for defect creation can be diminished to $1\times10^{19}$ cm$^{-3}$ or less. Accordingly, defect creation attributed to electrical stresses can be suppressed. With this method, sufficient deuterium atoms can be introduced into the silicon substrate where weak structures likely to the create defects exist, and into the gate insulator film in the vicinity of the interface thereof with the gate electrode, and the bonded states can be optimized so that a gate insulator film of high reliability can be realized irrespective of the sorts and directions of electrical stresses.

Figure 6:
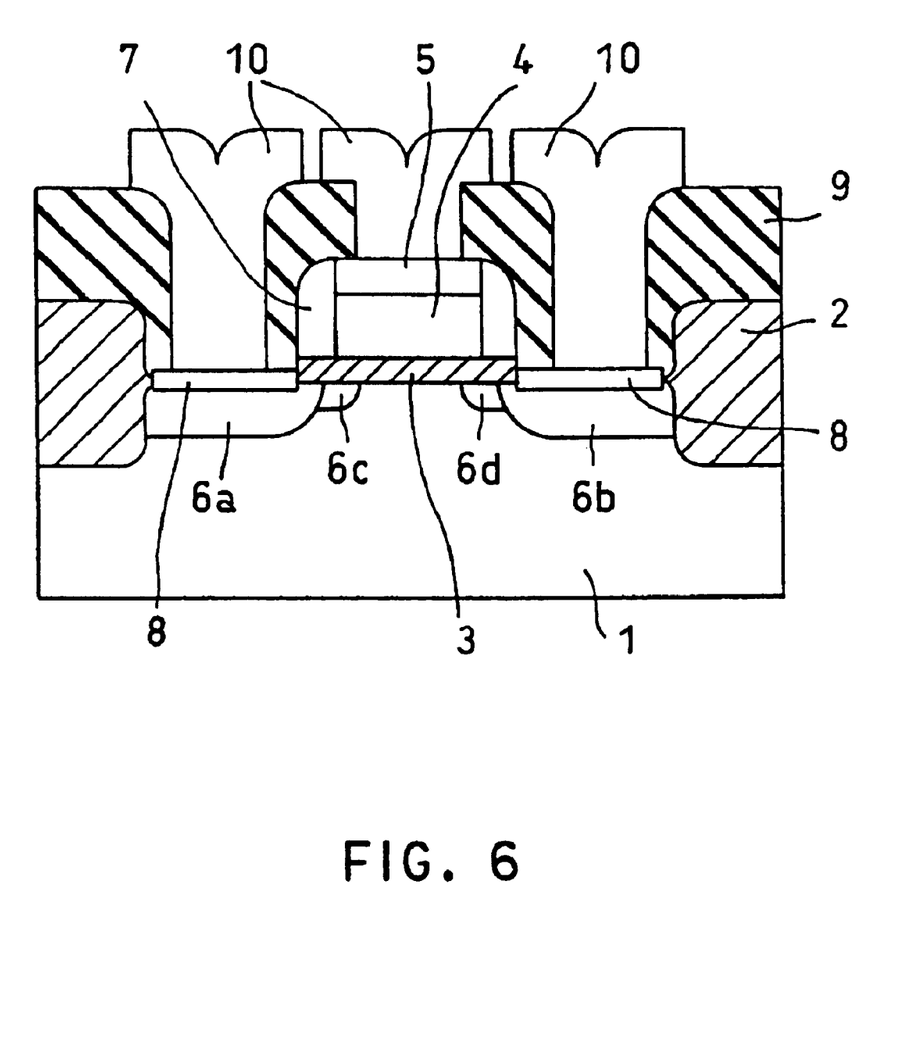
FIG. 6 is a sectional view of a field effect transistor in an embodiment of the present invention.

FIG. 6 is a sectional view of an n-channel transistor according to the present invention.

The n-channel transistor includes a p-type silicon substrate 1, a silicon oxide film 2 for device isolation as is formed on the p-type silicon substrate 1, n-type source diffusion region 6a and drain diffusion region 6b which are formed in the surface of the silicon substrate 1 and into which phosphorus ions are implanted, and a gate insulator film 3 which is formed on a part of the silicon substrate 1 between the regions 6a and 6b. The gate insulator film 3 is made of an oxynitride whose principal components are silicon, oxygen and nitrogen. The gate insulator film 3 includes deuterium. A source extension region 6c and a drain extension region 6d are respectively formed at end parts of the source diffusion region 6a and the drain diffusion region 6b underlying the gate insulator film 3. A source extension region 6c is n-type with a lower n-type impurity concentration than the source diffusion region 6a. A drain extension region 6d is n-type with a lower n-type impurity concentration than the drain diffusion region 6b.

A gate electrode 4 made of polycrystalline silicon is formed on the gate insulator film 3. The gate electrode 4 is overlaid with a silicide film 5. A gate sidewall film 7 includes a silicon nitride film and is formed on each of the sidewalls of the gate electrode 4. Silicide films 8 are respectively formed on the source diffusion region 6a and the drain diffusion layer 6b.

A silicon oxide film 9 deposited by CVD is formed across the surface of the resulting substrate. Contact holes are provided on the silicide films 5 and 8, and Al electrodes 10 configured to serve as wiring lines are formed in the contact holes by sputtering.

Next, the first manufacturing method of the transistor shown in FIG. 6 will be described.

First, a p-type silicon substrate 1 having, for example, a face orientation of (100) and a specific resistance of 4 Ωcm to 6 Ωcm is prepared, and a device isolating insulator film 2 being about 0.6 μm thick is formed on the front surface of the p-type silicon substrate 1 by a standard local oxidation technique.

Subsequently, the front surface of the silicon substrate 1 is thermally oxidized at 800° C. by mixing and burning, for example, hydrogen and oxygen, thereby to form a silicon oxide film being 7 nm thick. At the next step, the silicon oxide film is exposed into a deuterated ammonia (ND$_3$) gas atmosphere at, for example 850° C., thereby to form an oxynitride film doped with nitrogen. On this occasion, the process is carried out in a deuterated ammonia gas atmosphere and is carried out at a temperature which is not lower than the temperature of forming the silicon oxide film.

Owing to this step, deuterium is diffused into the vicinity of the interface between the oxynitride film and the silicon substrate 1, and hydrogen introduced at the oxidizing step is extracted. In this way, a gate insulator film 3 including deuterium is formed.

Figure 7:
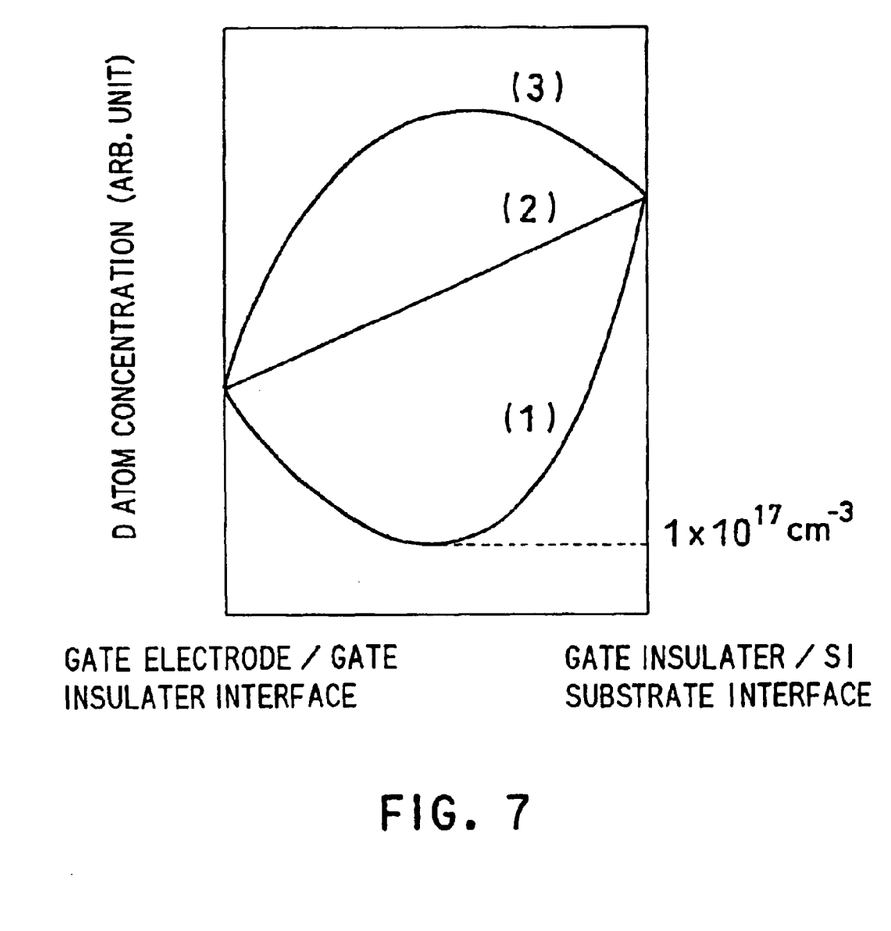
FIG. 7 is a diagram showing examples of a deuterium concentration profile in the gate insulator film of a field effect transistor in an embodiment of the present invention.

A deuterium concentration profile in the gate insulator film 3 in this example is indicated by a profile (1) in FIG. 7.

As shown by profile (1) in FIG. 7, the deuterium concentration in the intermediate region of the gate insulator film 3 in the direction of the thickness of this film is lower than a deuterium concentration in the vicinity of the interface of the gate insulator film 3 with a gate electrode, and is lower than a deuterium concentration in the vicinity of the interface with the silicon substrate 1.

When the nitriding process is performed, nitrogen is distributed so as to be concentrated at the interface between the silicon substrate 1 and the gate insulator film 3 and so as to be least in the gate insulator film. The number of available bonds on the nitrogen is 3 and is smaller by one as compared with the number 4 of the available bonds on silicon, so a defect ascribable to this fact is created. With this method, as shown by the profile (1) in FIG. 7, deuterium is distributed so as to be concentrated in the vicinity of the interface with the silicon substrate 1 where the nitrogen is higher, so that defects ascribable to the nitrogen are prevented and the oxynitride film is stabilized electrically.

Further, the Si—H bond which is especially weak from an electrical viewpoint is diminished in the vicinity of the interface with the silicon substrate 1, so that hydrogen is substituted by deuterium so as to form Si—D bonds which are electrically robust. Thus, any increase of a stress-induced leakage current after the application of a high electric field stress to the gate insulator film 3 is diminished.

Here in this example, the gate insulator film 3 is formed in such a way that the oxynitride film is formed on the silicon substrate 1 by employing the burning oxidation of the hydrogen and the oxygen, whereupon the gate insulator film is processed with deuterated ammonia. However, the example is not restrictive, and the gate insulator film 3 may be formed in other ways, such as for example, the silicon substrate 1 is oxidized by burning a mixed gas consisting of deuterium gas and oxygen gas, followed by a nitriding process with ammonia ($NH_3$). Even with this method, a similar deuterium distribution is obtained, and similar effects are attained. In this case, however, the oxidation serving as a deuterium introducing step needs to be performed at a temperature which is not lower than the temperature of the nitriding step with the ammonia.

At the next step, a polycrystalline silicon film being 200 nm thick is deposited as the gate electrode 4 on the gate insulator film 3. Subsequently, the polycrystalline silicon film is subjected to a phosphorus diffusion process at 850° C. for 30 minutes by employing, for example, phosphorus oxychloride ($POCl_3$), thereby to lower the resistance of the polycrystalline silicon film. Further, after patterning with a resist mask, the polycrystalline silicon film is etched by reactive ion etching, thereby to form the gate electrode 4.

Subsequently, ions of, for example, phosphorus are implanted at a dose of $1\times10^{16}$ $cm^{-2}$. The implanted phosphorus ions are distributed around a peak depth dependent upon the acceleration energy into the silicon substrate 1. Thereafter, phosphorus is diffused into the silicon substrate 1 and activated by a heat treatment which is performed, for example, at 950° C. for 30 seconds, thereby to form a source diffusion region and a drain diffusion region.

Subsequently, a gate sidewall insulator film 7 made of a silicon nitride film being about 50 nm thick is formed on each of the sidewalls of the gate electrode 4. The gate sidewall insulator films 7 are formed, for example, in such a way that a silicon nitride film being 50 nm thick is deposited across the entire surface of the resulting substrate by CVD, and the silicon nitride film is etched by reactive ion etching.

Subsequently, ions of phosphorus are implanted using the gate sidewall insulator films 7 as a mask. The implanted phosphorus ions are distributed around a peak depth dependent upon the acceleration energy into the silicon substrate 1. Thereafter, the implanted phosphorus is diffused into the silicon substrate 1 and activated by a heat treatment which is performed, for example, at 950° C. for 30 seconds. Owing to this step, a source diffusion region 6a and a drain diffusion region 6b are formed, while at the same time, a source extension region 6c and a drain extension region 6d are formed.

At the next step, a titanium film being 25 nm thick and a titanium nitride film being 50 nm thick are successively deposited across the entire surface of the substrate by sputtering. Subsequently, a heat treatment is performed at 700° C. in a nitrogen atmosphere for one minute, whereby the titanium film is entirely reacted with the silicon substrate 1. Owing to this step, a titanium silicide film 5 is formed on the gate electrode 4, and titanium silicide films 8 are respectively formed on the source diffusion region 6a and drain diffusion region 6b. Thereafter, the titanium nitride film and the unreacted titanium film on the insulator film are selectively removed by, for example, an aqueous solution of hydrofluoric acid and a mixed solution including sulfuric acid and hydrogen peroxide, respectively.

Subsequently, a silicon oxide film 9 being 300 nm thick is deposited across the entire surface of the substrate by CVD. Further, contact holes are provided by anisotropic dry etching in the parts of the silicon oxide film 9 corresponding to the silicide films 5 and 8.

Subsequently, an aluminum film which is 800 $\mu$m thick and which includes silicon and copper at respective concentrations of, for example, 0.5% is formed, and the aluminum film is thereafter patterned to form Al wiring lines 10.

Subsequently, in order to stabilize the nitrogen in the gate insulator film 3, the substrate is heat-treated at 450° C. for 15 minutes in a nitrogen atmosphere including 10% of hydrogen. In this way, the field effect transistor shown in FIG. 6 can be formed.

Next, the second manufacturing method of the transistor shown in FIG. 6 will be described.

First, a p-type silicon substrate 1 having, for example, a face orientation of (100) and a specific resistance of 4 $\Omega$cm to 6 $\Omega$cm is prepared, and a device isolating insulator film 2 being about 0.6 $\mu$m thick is formed on a front surface of the p-type silicon substrate 1 by standard local oxidation techniques.

Subsequently, the front surface of the silicon substrate 1 is thermally oxidized at 800° C. by mixing and burning, for example, hydrogen and oxygen, thereby to form a silicon oxide film. At the next step, the hydrogen gas is changed-over to deuterium gas, and burning oxidation is performed at 850° C. by a mixed gas including deuterium and hydrogen. Thus, a 7 nm thick silicon oxide film which includes deuterium and is formed. In this example, the thermal oxidation with deuterium is carried out at a temperature which is not lower than the temperature of forming the oxide film by the hydrogen burning oxidation. A heat treatment is performed in a nitrogen or oxygen atmosphere, whereby a gate insulator film 3 is formed.

A deuterium concentration profile in the gate insulator film 3 in this example is indicated by profile (2) in FIG. 7.

As shown by the profile (2) in FIG. 7, the deuterium concentration in an intermediate region of the gate insulator film 3 in the direction of the thickness of this film is lower than a deuterium concentration in the vicinity of the interface of the gate insulator film 3 with the silicon substrate 1, and the deuterium concentration in the intermediate region is higher than a deuterium concentration in the vicinity of the interface with a gate electrode 4.

Deuterium introduced by the deuterium burning oxidation diffused into the interface of the gate insulator film 3 with the silicon substrate 1, and distributed at the insulation film-silicon interface. Defects which are ascribable to a Si—H bond or Si—OH bond formed during the hydrogen burning oxidation are likely to appear in the gate insulator film 3 in the vicinity of the interface with the silicon substrate 1. In the vicinity of the interface with the silicon substrate 1, however, the defects can be efficiently stabilized by the deuterium distribution shown by the profile (2) in FIG. 7.

Moreover, since the deuterium is sufficiently distributed in an interior of the gate insulator film 3, creation of traps in the interior which can act as conduction paths of the stress-induced leakage current are diminished. Accordingly, the stress-induced leakage current can be effectively decreased.

As indicated by profile (3) in FIG. 7, a deuterium concentration is highest in the interior of the gate insulator film 3 and is higher in the vicinity of the interface with the silicon substrate 1 than in the vicinity of the interface with the gate electrode 4. Such a profile may be established by introducing higher deuterium concentrations in the deuterium gas introducing step. Thus, the stress-induced leakage current can be decreased still further. This is especially effective in case of, for example, a nonvolatile memory which utilizes an F-N tunnel current.

In order to achieve the deuterium distribution shown by the profile (3) in FIG. 7, the gate insulator film 3 made of an oxynitride film can be formed, for example, in such a way that the silicon substrate 1 is thermally oxidized by mixing and burning deuterium and oxygen, In the thermal oxidation, the deuterium gas is subsequently shut off so as to oxidize the resultant substrate with the oxygen gas only. The resultant substrate is further subjected to a nitriding process with deuterated ammonia ($ND_3$).

Figure 8:
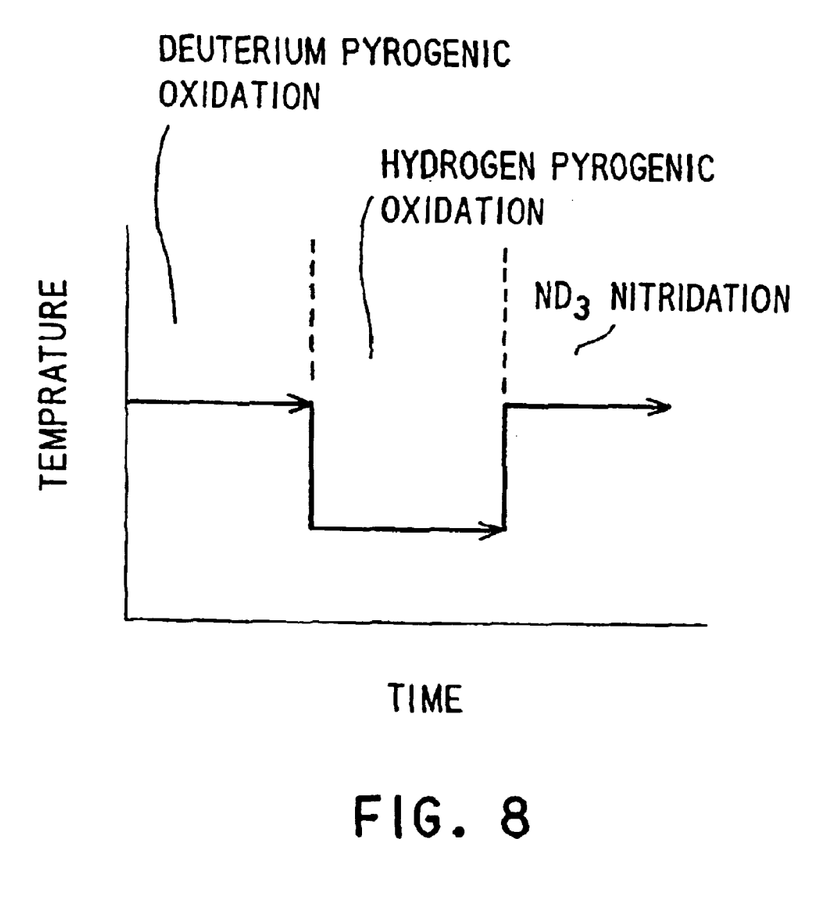
FIG. 8 is a diagram showing thermal hysteresis in a gate insulator formation process which includes the step of introducing deuterium.

A thermal hysteresis for this example is shown in FIG. 8. As shown in FIG. 8, the burning oxidation with deuterium and the process in the atmosphere of the deuterated ammonia gas are carried out at temperatures which are not lower than a temperature for forming the oxide film based on the afore-mentioned hydrogen burning oxidation. Thus, deuterium is diffused into the vicinity of the interface between the gate insulator film 3 made of oxynitride and the silicon substrate 1, while at the same time, the deuterium concentration is maximized in the interior of the gate insulator film 3.

At the next step, a polycrystalline silicon film being 200 nm thick is deposited for the gate electrode 4 on the gate insulator film 3. Subsequently, the polycrystalline silicon film is subjected to a phosphorus diffusion process at 850° C. for 30 minutes by employing, for example, phosphorus oxychloride ($POCl_3$), thereby to lower the resistance of the polycrystalline silicon film. Further, after patterning with a resist mask, the polycrystalline silicon film is etched by reactive ion etching, thereby to form the gate electrode 4. Subsequently, ions of, for example, phosphorus are implanted at a dose of $1 \times 10^{16}$ $cm^{-2}$. The implanted phosphorus ions are distributed around a peak depth dependent upon the acceleration energy into the silicon substrate 1.

Thereafter, the implanted phosphorus is diffused into the silicon substrate 1 and activated by a heat treatment which is performed, for example, at 950° C. for 30 seconds, thereby to form a source diffusion region and a drain diffusion region.

Subsequently, a gate sidewall insulator film 7 which is made of a silicon nitride film being about 50 nm thick is formed on each of the sidewalls of the gate electrode 4. The gate sidewall insulator films 7 are formed, for example, in such a way that a silicon nitride film being 50 nm thick is deposited across the entire surface of the resulting substrate by CVD, and then the silicon nitride film is etched by reactive ion etching.

Subsequently, ions of phosphorus are implanted using the gate sidewall insulator films 7 as a mask. The implanted phosphorus ions are distributed around a peak depth dependent upon the acceleration energy into the silicon substrate 1. Thereafter, the implanted phosphorus is diffused into the silicon substrate 1 and activated by a heat treatment which is performed, for example, at 950° C. for 30 seconds. Owing to this step, a source diffusion region 6a and a drain diffusion region 6b are formed, while at the same time, a source extension region 6c and a drain extension region 6d are formed.

At the next step, a titanium film being 25 nm thick and a titanium nitride film being 50 nm thick are successively deposited across the entire surface of the resultant substrate by sputtering. Subsequently, a heat treatment is performed at 700° C. in a nitrogen atmosphere for one minute, whereby the titanium film is entirely reacted with the silicon substrate 1. Owing to this step, a titanium silicide film 5 is formed on the gate electrode 4, and titanium silicide films 8 are respectively formed on the source diffusion region 6a and drain diffusion region 6b. Thereafter, the titanium nitride film and the unreacted titanium film on the insulator film are selectively removed by, for example, an aqueous solution of hydrofluoric acid and a mixed solution including sulfuric acid and hydrogen peroxide, respectively.

Subsequently, a silicon oxide film 9 being 300 nm thick is deposited across the entire surface of the substrate by CVD. Contact holes are provided by anisotropic dry etching in parts of the silicon oxide film 9 corresponding to the silicide films 5 and 8.

Subsequently, an aluminum film which is 800 nm thick and which includes silicon and copper at respective concentrations of, for example, 0.5% is formed, and the aluminum film is thereafter patterned to form Al wiring lines 10.

Subsequently, in order to stabilize the nitrogen in the gate insulator film 3, the substrate is heat-treated at 450° C. for 15 minutes in a nitrogen atmosphere including 10% of hydrogen. In this way, the field effect transistor shown in FIG. 6 can be formed.

With the second manufacturing method, the silicon oxide film has been exemplified as the gate insulator film 3, but this exemplification is not restrictive. As an alternative example, a silicon nitride film doped with deuterium is formed on the silicon substrate 1 by employing deuterated silane ($SiD_4$) and deuterated ammonia ($ND_3$). Subsequently, silicon nitride films are stacked by employing silane ($SiH_4$) and the deuterated ammonia ($ND_3$), and the silane ($SiH_4$) and ammonia ($NH_3$). Thus, a similar profile is attained, and the reliability of the composite silicon nitride film is heightened.

Next, a third manufacturing method of the transistor shown in FIG. 6 will be described.

First, a p-type silicon substrate 1 having, for example, a face orientation of (100) and a specific resistance of 4 $\Omega$cm to 6 $\Omega$cm is prepared, and a device isolating insulator film 2 being about 0.6 $\mu$m thick is formed on a front surface of the p-type silicon substrate 1 by standard local oxidation techniques.

Subsequently, the front surface of the silicon substrate 1 is thermally oxidized at 800° C. by mixing and burning, for example, deuterium and oxygen, thereby to form a silicon oxide film. At the next step, the silicon oxide film is subjected to a nitriding process at 850° C. in, for example, a deuterated ammonia ($ND_3$) atmosphere. Thus, a gate insulator film 3 including a silicon oxynitride film which is 7 nm thick and which includes deuterium is formed. In this manner, the step of introducing deuterium occurs simultaneously with the formation of the gate insulator film 3.

Subsequently, a polycrystalline silicon film being 200 nm thick is deposited for a gate electrode 4 on the gate insulator film 3. Further, the polycrystalline silicon film is subjected to a phosphorus diffusion process at 850° C. for 30 minutes by employing, for example, phosphorus oxychloride ($POCl_3$), thereby to lower the resistance of the polycrystalline silicon film. Besides, after patterning with a resist mask, the polycrystalline silicon film is etched by reactive ion etching, thereby to form the gate electrode 4.

Subsequently, oxidation with a mixed gas including deuterium gas and oxygen gas is performed to oxidize the surface of the polycrystalline silicon of the gate electrode 4 and to recover damages at the gate electrode. Deuterium is simultaneously introduced into the gate insulator film 3 still further, so that a desired deuterium concentration profile can be attained. In this example, post-oxidation step by the above-mentioned burning oxidation with the deuterium is carried out at a temperature which is not lower than the temperature for forming the gate insulator film 3. The heat-treatment temperature in this example is at least 800° C., more preferably at least 850° C.

Subsequently, ions of, for example, phosphorus are implanted at a dose of $1\times10^{16}$ cm$^{-2}$. The implanted phosphorus ions are distributed around a peak depth dependent upon the acceleration energy into the silicon substrate 1. Thereafter, the implanted phosphorus is diffused into the silicon substrate 1 and activated by a heat treatment which is performed, for example, at 950° C. for 30 seconds, thereby to form a source diffusion region and a drain diffusion region.

Subsequently, a gate sidewall insulator film 7 which is made of a silicon nitride film being about 50 nm thick is formed on each of the sidewalls of the gate electrode 4. The gate sidewall insulator films 7 are formed, for example, in such a way that a silicon nitride film being 50 nm thick is deposited across the entire surface of the resulting substrate by CVD, and that silicon nitride film is etched by reactive ion etching.

Subsequently, ions of phosphorus are implanted using the gate sidewall insulator films 7 as a mask. The implanted phosphorus ions are distributed around a peak depth dependent upon the acceleration energy into the silicon substrate 1. Thereafter, the implanted phosphorus is diffused into the silicon substrate 1 and activated by a heat treatment which is performed, for example, at 950° C. for 30 seconds. Owing to this step, a source diffusion region 6a and a drain diffusion region 6b are formed, while at the same time, a source extension region 6c and a drain extension region 6d are formed.

At the next step, a titanium film being 25 nm thick and a titanium nitride film being 50 nm thick are successively deposited across the entire surface of the substrate by sputtering. Subsequently, a heat treatment is performed at 700° C. in a nitrogen atmosphere for one minute, whereby the titanium film is entirely reacted with the silicon substrate 1. Owing to this step, a titanium silicide film 5 is formed on the gate electrode 4, and titanium silicide films 8 are respectively formed on the source diffusion region 6a and drain diffusion region 6b. Thereafter, the titanium nitride film and the unreacted titanium film on the insulator film are selectively removed by, for example, an aqueous solution of hydrofluoric acid and a mixed solution including sulfuric acid and hydrogen peroxide, respectively.

Subsequently, a silicon oxide film 9 being 300 nm thick is deposited across the entire surface of the resultant substrate by CVD. Contact holes are provided by anisotropic dry etching in parts of the silicon oxide film 9 corresponding to the silicide films 5 and 8.

Subsequently, an aluminum film which is 800 nm thick and which includes silicon and copper at respective concentrations of, for example, 0.5% is formed, and the aluminum film is thereafter patterned to form Al wiring lines 10.

Subsequently, in order to stabilize the nitrogen in the gate insulator film 3, the substrate is heat-treated at 450° C. for 15 minutes in a nitrogen atmosphere including 10% of hydrogen. In this way, the field effect transistor shown in FIG. 6 can be formed.

With the third manufacturing method, deuterium is introduced by the oxidation during the formation of the gate insulator film 3 and the oxidation after the formation of the gate electrode 4. However, this is not restrictive, but similar effects are attained even in a case where the gate insulator film 3 is formed by the burning oxidation of hydrogen gas and oxygen gas, and so forth, and where deuterium is introduced only by the oxidation after the working of the gate electrode 4. In this example, the deuterium burning oxidation occurs after the formation of the gate electrode 4 and at a temperature which is not lower than a temperature for forming the gate insulator film 3. Similar effects are attained when a diffusion source of deuterium is disposed at the periphery of the gate electrode 4 and where deuterium is diffused from the diffusion source. In this approach, a nitride film including deuterium at a high concentration, a polycrystalline silicon film doped with deuterium, or a silicon oxide film doped with deuterium, for example, are disposed at the periphery of the gate electrode 4 so as to diffuse the deuterium from the film into the gate electrode 4.

The above manufacturing methods of the transistor have been described by exemplifying the silicon thermal-oxidation film, the silicon nitride film and the oxynitride film as the gate insulator films 3. However, these films are not restrictive, and similar methods are applicable to other ferroelectric films or oxide films or silicate films at interface layers of ferroelectric films. Moreover, the methods of the present invention can be performed in various modifications within a scope not departing from the purport of the present invention.

According to the present invention, concentration profile of deuterium atoms in a gate insulator film is controlled, whereby a stress-induced leakage current ascribable to dielectric breakdown or interface state creation can be prevented to improve the electrical characteristics of the gate insulator film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate;
   a gate insulator film formed on said silicon substrate and including silicon and deuterium and at least one of oxygen and nitrogen; and
   a gate electrode formed on said gate insulator film;
   wherein a deuterium concentration in a vicinity of an interface of said gate insulator film with said gate electrode is at least $1\times10^{17}$ cm$^{-3}$, and a deuterium concentration in a vicinity of an interface of said gate insulator film with said silicon substrate is higher than the deuterium concentration in the vicinity of the interface of said gate insulation film with said gate electrode.

2. A semiconductor device according to claim 1, wherein the deuterium concentration in the vicinity of the interface of said gate electrode with said silicon substrate is at least $1\times10^{18}$ cm$^{-3}$.

3. The semiconductor device according to claim 1, wherein a deuterium concentration throughout the gate insulator film is at least $1\times10^{17}$ cm$^{-3}$ and a hydrogen concentration thereof is at most $1\times10^{19}$ cm$^{-3}$.

4. The semiconductor device according to claim 3, wherein the deuterium concentration throughout the gate insulator film is at least $2 \times 10^{18}$ cm$^{-3}$.

5. The semiconductor device according to claim 1, wherein a deuterium concentration in an interior region of said gate insulator film away from said gate electrode is higher than the deuterium concentration in the vicinity of the interface of said gate insulator with said silicon substrate.

6. The semiconductor device according to claim 1, wherein a deuterium concentration in an interior region of said gate insulator film away from said gate electrode is lower than the deuterium concentration in the vicinity of the interface with said silicon substrate and is higher than the deuterium concentration in the vicinity of the interface of said gate insulator with said gate electrode.

7. The semiconductor device according to claim 1, wherein a deuterium concentration in an interior region of said gate insulator film away from said gate electrode is lower than the deuterium concentration in the vicinity of the interface of said gate insulator with said gate electrode.

8. The semiconductor device according to claim 1, wherein said gate insulator film includes a silicon atom which is bonded with at most three oxygen atoms, a deuterium atom which is bonded with the silicon atom, and a deuterium atom which is bonded with another oxygen atom.

9. The semiconductor device according to claim 1, further comprising:

a source region and a drain region, the source region and the drain region formed such that said gate insulator film is located therebetween.

* * * * *